United States Patent
Liao et al.

(10) Patent No.: US 10,516,129 B2
(45) Date of Patent: Dec. 24, 2019

(54) OLED DEVICE, METHOD FOR DRIVING OLED DEVICE, OLED SUBSTRATE, METHOD FOR MANUFACTURING OLED SUBSTRATE AND DISPLAY DEVICE

(71) Applicants: BOE Technology Group Co., Ltd., Beijing (CN); HEFEI XINSHENG OPTOELECTRONICS TECHNOLOGY CO., LTD., Anhui (CN)

(72) Inventors: Chinlung Liao, Beijing (CN); Yue Hu, Beijing (CN)

(73) Assignees: BOE TECHNOLOGY GROUP CO., LTD., Beijing (CN); HEFEI XINSHENG OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/986,067

(22) Filed: May 22, 2018

(65) Prior Publication Data

US 2019/0157597 A1 May 23, 2019

(30) Foreign Application Priority Data

Nov. 21, 2017 (CN) .......................... 2017 1 1170071

(51) Int. Cl.
*H01L 51/50* (2006.01)
*H01L 51/52* (2006.01)
*H01L 51/56* (2006.01)
*H01L 27/32* (2006.01)

(52) U.S. Cl.
CPC ........ *H01L 51/504* (2013.01); *H01L 27/3209* (2013.01); *H01L 51/508* (2013.01); *H01L 51/5064* (2013.01); *H01L 51/5203* (2013.01); *H01L 51/5206* (2013.01);
(Continued)

(58) Field of Classification Search
CPC ... H01L 51/504; H01L 51/5203; H01L 51/56; H01L 51/5221; H01L 51/5206; H01L 51/508; H01L 51/5064
See application file for complete search history.

(56) References Cited

U.S. PATENT DOCUMENTS

| | | |
|---|---|---|
| 5,837,391 A | 11/1998 | Utsugi |
| 7,199,521 B2 | 4/2007 | Ibe |
| 7,548,022 B2 | 6/2009 | Ibe |

(Continued)

FOREIGN PATENT DOCUMENTS

| | | |
|---|---|---|
| CN | 1665360 A | 9/2005 |
| CN | 100440528 C | 12/2008 |

(Continued)

OTHER PUBLICATIONS

First Office Action, including Search Report, for Chinese Patent Application No. 201711170071.6, dated Feb. 1, 2019, 19 pages.

*Primary Examiner* — Joseph C. Nicely
(74) *Attorney, Agent, or Firm* — Westman, Champlin & Koehler, P.A.

(57) ABSTRACT

An OLED device, a method for driving the OLED device, an OLED substrate, a method for manufacturing the OLED substrate, and a display device are provided. The OLED device includes: an anode, a first light emitting element, a common electrode, a second light emitting element, and a cathode, which are arranged in sequence.

18 Claims, 4 Drawing Sheets

(52) U.S. Cl.
CPC .......... *H01L 51/5221* (2013.01); *H01L 51/56* (2013.01); *G02F 2201/121* (2013.01); *H01L 27/322* (2013.01)

(56) References Cited

U.S. PATENT DOCUMENTS

| | | | |
|---|---|---|---|
| 8,207,665 | B2 | 6/2012 | Ibe |
| 8,288,951 | B2 | 10/2012 | Storch et al. |
| 8,354,980 | B2 | 1/2013 | Kwak |
| 8,680,693 | B2 | 3/2014 | Kang et al. |
| 9,028,974 | B2 | 5/2015 | Kang et al. |
| 9,406,897 | B2 | 8/2016 | Okamoto et al. |
| 2004/0232828 | A1 | 11/2004 | Kimura et al. |
| 2005/0184659 | A1 | 8/2005 | Ibe |
| 2005/0189875 | A1* | 9/2005 | Nakada ............... H01L 27/3209 313/504 |
| 2006/0232992 | A1 | 10/2006 | Bertram et al. |
| 2007/0182315 | A1 | 8/2007 | Ibe |
| 2009/0009101 | A1 | 1/2009 | Kang et al. |
| 2009/0184628 | A1 | 7/2009 | Kang et al. |
| 2010/0051990 | A1 | 3/2010 | Ibe |
| 2010/0097295 | A1 | 4/2010 | Kwak |
| 2015/0287949 | A1 | 10/2015 | Okamoto et al. |
| 2018/0331161 | A1* | 11/2018 | Liao ..................... H01L 27/3209 |
| 2019/0051243 | A1* | 2/2019 | Li ........................ G09G 3/3258 |
| 2019/0051245 | A1* | 2/2019 | Jun ...................... G09G 3/3258 |
| 2019/0103451 | A1* | 4/2019 | Kimura ............... H01L 27/3246 |

FOREIGN PATENT DOCUMENTS

| | | |
|---|---|---|
| CN | 101371619 A | 2/2009 |
| CN | 101401487 A | 4/2009 |
| CN | 101728419 A | 6/2010 |
| CN | 1742518 B | 9/2010 |
| CN | 104979482 A | 10/2015 |
| CN | 104538553 B | 8/2017 |

* cited by examiner

OLED DEVICE, METHOD FOR DRIVING OLED DEVICE, OLED SUBSTRATE, METHOD FOR MANUFACTURING OLED SUBSTRATE AND DISPLAY DEVICE

CROSS-REFERENCE TO RELATED APPLICATION

This application claims the benefit of Chinese Patent Application No. 201711170071.6 filed on Nov. 21, 2017 in the State Intellectual Property Office of China, the whole disclosure of which is incorporated herein by reference.

BACKGROUND OF THE INVENTION

Field of the Invention

The present disclosure relates to the field of display technologies, and in particular to an OLED device, a method for driving the OLED device, an OLED substrate, a method for manufacturing the OLED substrate and a display device.

Description of the Related Art

An OLED (Organic Light Emitting Diode) display generally includes a red organic light emitting material, a green organic light emitting material, and a blue organic light emitting material. However, such organic light emitting materials are prone to degradation and have a short service life.

SUMMARY OF THE INVENTION

According to an aspect of the present disclosure, there is provided an OLED device comprising: an anode, a first light emitting element, a common electrode, a second light emitting element, and a cathode, which are arranged in sequence.

In an embodiment, the anode and the cathode are electrically connected and the electrically connected anode and the cathode constitute a first signal terminal, and the common electrode constitutes a second signal terminal.

In an embodiment, a material of the common electrode comprises a metal material; or a material of the common electrode comprises a metal material and a charge transport material; and wherein a content of the metal material of the common electrode is 2%~30%, and wherein the content is a mass content, a molar content, or a volume content.

In an embodiment, the first light emitting element between the anode and the common electrode comprises a first hole transport layer, a first light emitting layer, and a first electron transport layer which are arranged in sequence in a direction from the anode to the common electrode.

In an embodiment, the second light emitting element between the common electrode and the cathode comprises a second hole transport layer, a second light emitting layer and a second electron transport layer which are arranged in sequence in a direction from the common electrode to the cathode.

In an embodiment, the first light emitting element comprises one of a red organic light emitting layer, a green organic light emitting layer, and a blue organic light emitting layer.

In an embodiment, the second light emitting element comprises a white organic light emitting layer.

According to an aspect of the present disclosure, there is provided a method for driving an OLED device according to claim 1, comprising:

inputting an AC signal to the OLED device, so that the first light emitting element and the second light emitting element emit light alternately under the control of the AC signal;

or, inputting a DC signal to the OLED device, so that the first light emitting element or the second light emitting element emits light under the control of the DC signal.

According to an aspect of the present disclosure, there is provided an OLED substrate comprising a plurality of OLED devices according to claim 1 arranged in an array on a substrate.

According to an aspect of the present disclosure, there is provided an OLED substrate comprising a power line and a common signal line, in which the OLED substrate further comprises a plurality of above OLED devices arranged in an array on a substrate;

wherein the common signal line is connected to the first signal terminal of each of the OLED devices, and the power line is connected to the second signal terminal of each of the OLED devices through transistors; or the common signal line is connected to the second signal terminal of each of the OLED devices, and the power line is connected to the first signal terminal of each of the OLED devices through transistors.

In an embodiment, the OLED substrate comprises red sub-pixel regions, green sub-pixel regions, and blue sub-pixel regions;

the first light emitting element of the OLED device in the red sub-pixel region comprises a red organic light emitting layer, the first light emitting element of the OLED device in the green sub-pixel region comprises a green organic light emitting layer, the first light emitting element of the OLED device in the blue sub-pixel region comprises a blue organic light emitting layer;

the second light emitting element in each of the sub-pixel regions comprises a white light emitting layer.

In an embodiment, the OLED substrate further comprises a color filter on a light exiting side of the OLED device.

In an embodiment, the white light emitting layer comprises a red organic light emitting sub-layer, a green organic light emitting sub-layer and a blue organic light emitting sub-layer which are stacked; in each of the light emitting elements of the plurality of the OLED devices of the OLED substrate having the white light emitting layer, the organic light emitting sub-layers with same color are in a same layer.

According to an aspect of the present disclosure, there is provided a display device comprising a power module and the above OLED substrate, wherein the power module inputs one of a DC signal and an AC signal to the OLED substrate.

According to an aspect of the present disclosure, there is provided a method for manufacturing an OLED substrate, comprising:

forming a first electrode, a first light emitting element, a common electrode, a second light emitting element, and a second electrode on the substrate, which are stacked in sequence.

According to an aspect of the present disclosure, there is provided a method for manufacturing an OLED substrate, wherein the OLED substrate comprises a power line and a common signal line, the method comprising:

forming a first electrode, a first light emitting element, a common electrode, a second light emitting element, and a second electrode sequentially stacked on the substrate; wherein electrically connecting the first electrode and the second electrode, and forming a first signal terminal with the first electrode and the second electrode which are electrically connected and forming a second signal terminal with the common electrode;

wherein connecting the common signal line to the first signal terminal, connecting the power line to the second signal terminal through a transistor, or connecting the common signal line to the second signal terminal, connecting the power line to the first signal terminal through a transistor.

In an embodiment, the first electrode is an anode and the second electrode is a cathode.

In an embodiment, forming an anode, a first light emitting element, a common electrode, a second light emitting element, and a cathode sequentially stacked on the substrate, comprises:

forming a first hole injection layer, a first hole transport layer and a first light emitting layer on the substrate sequentially with an ink jet printing process;

forming a first electron transport layer, the common electrode, a second hole injection layer, a second hole transport layer, a second light emitting layer, a second electron transport layer and a second electron injection layer sequentially on the first light emitting layer with an evaporation process;

wherein, the first hole injection layer, the first hole transport layer, the first light emitting layer, and the first electron transport layer constitute the first light emitting element; the second hole injection layer, the second hole transport layer, the second light emitting layer, the second electron transport layer, and the electron injection layer constitute the second light emitting element.

In an embodiment, forming the first light emitting layer of the first light emitting element in the pixel regions so that a red organic light emitting layer is formed in a red sub-pixel region, a green organic light is formed in a green sub-pixel region, and a blue organic light is formed in a blue sub-pixel region.

In an embodiment, forming the second light emitting layer of the second light emitting element in the pixel regions so that the second light emitting layer comprises a white light emitting layer, wherein the white light emitting layer comprises the red organic light emitting sub-layer, the green organic light emitting sub-layer, and the blue organic light emitting sub-layer which are stacked in each of the sub-pixel regions; and arranging the organic light emitting sub-layers with same color in the white light emitting layer of each of the second light emitting elements in a same layer.

BRIEF DESCRIPTION OF THE DRAWINGS

In order to more clearly describe the technical solution in the embodiments of the present disclosure or the related art, the drawings used in the description of the embodiments of the present disclosure or the related art will be briefly described below, and it is obvious that the drawings in the following description are only some embodiments of the present disclosure. Those skilled in the art may also obtain other drawings based on these drawings without any inventive efforts.

FIG. 1b is an equivalent circuit connection diagram of the OLED device shown in FIG. 1a;

DETAILED DESCRIPTION OF PREFERRED EMBODIMENTS

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by those skilled in the art based on the embodiments of the present disclosure without inventive efforts shall fall within the protection scope of the present disclosure.

Figure 1A:
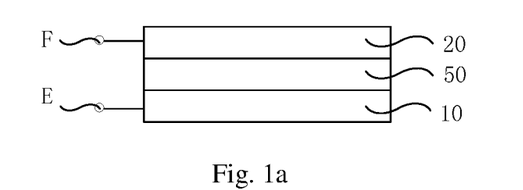
FIG. 1a is a schematic structural diagram of an OLED device in related art.
Figure 1B:
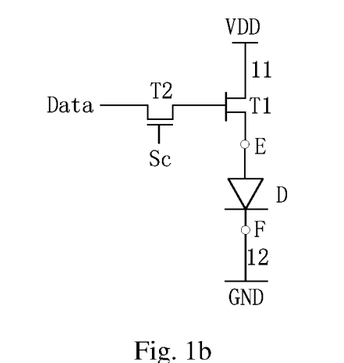

An OLED device of the related art, as shown in FIG. 1a, includes an anode 10, a cathode 20, and an organic light emitting layer 50 between the cathode 20 and the anode 10. The anode 10 constitutes a first signal terminal E and the cathode 20 constitutes a second signal terminal F. FIG. 1b is an equivalent circuit connection diagram of the OLED device shown in FIG. 1a, in which the OLED device is designated by D. A gate of a switching transistor T2 is connected to the control signal terminal Sc, a first electrode of the switching transistor T2 is connected to a data line Data, and a second electrode of the switching transistor T2 is connected to a gate of a driving transistor T1, a first electrode of the driving transistor T1 is connected to a power line 11, and a second electrode of the driving transistor T1 is connected to the first signal terminal E, the second signal terminal F is connected to a common signal line 12.

It should be noted that the common signal line 12 may also be known as a COM line. When an OLED display device includes a plurality of OLED devices of the related art which share a common cathode, cathodes 20 of the respective OLED devices are all connected to the common signal line 12. When an OLED display device includes a plurality of OLED devices of the related art which share a common anode, anodes 10 of the respective OLED devices are all connected to the common signal line 12. It will be appreciated by those skilled in the art that FIG. 1b is merely an illustration of an equivalent circuit connection diagram of an OLED device of the related art. In an actual circuit, other transistors may be included in addition to the switching transistor T2 and the driving transistor T1.

When an OLED device of the related art is working, under a control of the control signal terminal Sc, the signal of the data line Data is written into the gate of the driving transistor T1 through the switching transistor T2, and the driving transistor T1 may turned on under the control. The signal VDD of a power terminal is output to the power line 11, and then is input to the anode of the diode D through the driving transistor T1. The cathode of the diode D is connected to the common signal line 12. For example, the common signal line 12 is connected to a grounded terminal GND. A data signal provided by the data line Data determines a magnitude of a power voltage written into the anode of the diode D, so as to control a light emission brightness of the OLED device.

Figure 2:
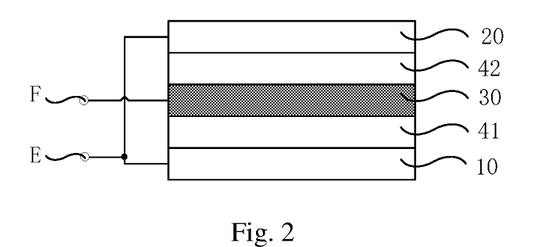
FIG. 2 is a schematic structural diagram of an OLED device provided by an embodiment of the present disclosure.

An embodiment of the present disclosure provides an OLED device, as shown in FIG. 2, comprises a anode 10, a first light emitting element 41, a common electrode 30, a second light emitting element 42, and a cathode 20 which are arranged in sequence. The anode 10 and the cathode 20 are electrically connected. The anode 10 and the cathode 20 that are electrically connected constitute a first signal terminal E, and the common electrode 30 constitutes a second signal terminal F.

It should be noted that the input signals of the first signal terminal E and the second signal terminal F of the OLED device provided in the present disclosure may be the same as the input signals of the first signal terminal E and the second signal terminal F of the OLED device of the related art; however, there is a difference lying in that, in the embodiment of the present disclosure, the signal of the first signal terminal E is input to the anode 10 and the cathode 20, and the signal of the second signal terminal F is input to the common electrode 30. The first light emitting element 41 may be controlled to emit light according to the voltages of the anode 10 and the common electrode 30, and the second light emitting element 42 may be controlled to emit light according to the voltages of the cathode 20 and the common electrode 30. On such a basis, by controlling the voltage between the adjacent electrodes, the light emission brightness of the first light emitting element 41 or the second light emitting element 42 may be controlled.

In addition, the materials of the cathode 20 and the anode 10 are not limited in the context. For example, the anode 10 may be made of a transparent conductive material such as indium tin oxide or indium zinc oxide. For example, the cathode 20 may be made of a metal material.

In addition, the material of the common electrode 30 is not limited in the context, as long as the first light emitting element 41 may emit light under the control of the anode 10 and the common electrode 30, or the second light emitting element 42 may emit light under the control of the cathode 20 and the common electrode 30. For example, the common electrode 30 may be a charge generation layer (abbreviated as: CGL). For example, the material of the common electrode 30 may include a metal material. In this situation, in order to ensure the light emitting effect of the first light emitting element 41, it is necessary to make the common electrode 30 thinner so as to improve a light transmittance of the common electrode 30. As another example, the material of the common electrode 30 includes a mixed material of a metal material and a charge transport material. In case that the content of the metal material in the common electrode 30 is less than 2%, the common electrode 30 has a electrical conductive property too poor to cooperate with the anode 10 for causing the first light emitting element 41 to emit light, and to cooperate with the cathode 20 for causing the second light emitting element 42 to emit light. In case that the content of the metal material in the common electrode 30 is greater than 30%, the light transmittance of the common electrode 30 is relatively poor, which will adversely affect a light emitting effect of the first light emitting element 41. In summary, the content of the metal material in the common electrode 30 is suitable within a scope of 2% to 30%. It should be noted that the above content may be a mass content, a molar content, a volume content, etc., which is not limited in the present disclosure. The charge transport material may be a material used for making a hole transport layer (abbreviated as: HTL) of related art, or a material used for making an electron transport layer (abbreviated as: ETL) of related art, which is not limited in the present disclosure. For example, the material constituting the common electrode 30 is a mixed material of lithium (Li) and an electron transport material, and the content of lithium in the common electrode 30 may be 6%.

In addition, colors of the light emitted by the first light emitting element 41 and the second light emitting element 42 are not limited in the context.

Based on this, an embodiment of the present disclosure provides an OLED device including an anode 10, a first light emitting element 41, a common electrode 30, a second light emitting element 42, and a cathode 20 which are arranged in sequence. The anode 10 and the cathode 20 are electrically connected. The electrically connected anode 10 and the cathode 20 constitute a first signal terminal E, and the common electrode 30 constitutes a second signal terminal F. For the first light emitting element 41, the common electrode 30 serves as a cathode; for the second light emitting element 42, the common electrode 30 serves as an anode. In this situation, electric signals are respectively input to the first signal terminal E and the second signal terminal F, a potential E1 of the anode 10 is equal to a potential E3 of the cathode 20. When a potential E2 of the common electrode 30 satisfies a relationship of E3=E1>E2, i.e., the first light emitting element 41 is subject to a forward-bias voltage, the first light emitting element 41 emits light; while the second light emitting element 42 is subject to a reverse-bias voltage, the second light emitting element 42 does not emit light. When the potential E2 of the common electrode 30 satisfies a relationship of E3=E1<E2, i.e., the first light emitting element 41 is subject to a reverse-bias voltage, the first light emitting element 41 does not emit light; while the second light emitting element 42 is subject to a forward-bias voltage, i.e., the second light emitting element 42 emits light. In this way, by controlling the potentials of the anode 10, the cathode 20, and the common electrode 30, the first light emitting element 41 or the second light emitting element 42 may emit light under the control, or alternatively, the first light emitting element 41 and the second light emitting element 42 may emit light alternately. Compared with the OLED device of related art having only one organic light emitting layer, the service life of the OLED device provided by the embodiments of the present disclosure is significantly improved, and at the same time, the problem of poor display effect due to the degradation of the material of the organic light emitting layer during a late stage of the use of the OLED device of the related art may be avoided, thereby improving display performance of OLED devices.

Figure 3:
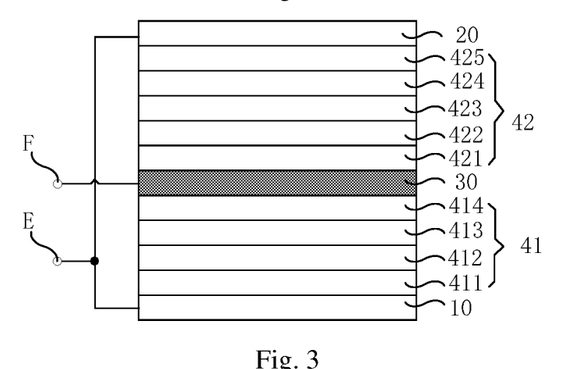
FIG. 3 is a schematic structural diagram of a first light emitting layer and a second light emitting layer in the OLED device shown in FIG. 2.

In addition, the specific layer structures of the first light emitting element 41 and the second light emitting element 42 are not limited in the context. Exemplarily, as shown in FIG. 3, the first light emitting element 41 may include a first hole injection layer (abbreviated as: HIL) 411, a first hole transport layer 412, a first light emitting layer 413, and a first electron transport layer 414. The second light emitting element may include a second hole injection layer 421, a second hole transport layer 422, a second light emitting layer 423, a second electron transport layer 424, and an electron injection layer (abbreviated as: EIL) 425. Of cause, the first light emitting element 41 may also only include the first hole transport layer 412, the first light emitting layer (abbreviated as: EML) 413 and the first electron transport layer 414. The second light emitting element may also only include the second hole transport layer 422, the second light emitting layer 423 and the second electron transport layer 424.

In summary, the common electrode 30 is very important in the OLED device. On one hand, the common electrode 30 is used to connect the first light emitting element 41 and the second light emitting element 42; on the other hand, the common electrode 30 also needs to have a function of generating, transporting and injecting charges so that the common electrode 30 may serve as the cathode of the first light emitting element 41 and may serve as the anode of the second light emitting element 42. For example, the material constituting the common electrode 30 includes a metal material and a charge transport material. The content of the metal material in the common electrode 30 is 2% to 30%. In this situation, under the effect of a voltage applied externally, in the charge transport material, the metal material easily loses electrons and transfers electrons to the first electron transport layer 414 in the first light emitting element 41 and transmits the holes to the second light emitting element. 42. By mixing the metal material with the charge transporting material, both yield and efficiency in generating electrons and holes from the metal material may be improved, that is, the yield and efficiency in generating electrons and holes from the common electrode 30 are improved, thereby improving the luminous efficiency of the first light emitting element 41 and the second light emitting element 42.

In order to further improve the efficiency of the metal material to generate electrons and holes, the metal material may be an alkali metal. For example, the metal material includes at least one of lithium, sodium, potassium, rubidium, cesium, and francium. In this situation, the metal material is more likely to lose electrons and generate holes under the effect of a voltage applied externally, so that the luminous efficiency of the first light emitting element 41 and the second light emitting element 42 may be further improved.

An embodiment of the present disclosure provides a method for driving the above OLED device, including: inputting an alternating current (AC) signal to the first signal terminal E and the second signal terminal F, so that the first light emitting element 41 and the second light emitting element emit light alternately under the control of the AC signal.

Specifically, when the potential E1 of the anode 10, the potential E2 of the common electrode 30, and the potential E3 of the cathode 20 satisfies the relation of E3=E1>E2 under the control of the AC signal, the first light emitting element 41 emits light and the second light emitting element 42 does not emit light. When they satisfies the relation of E3=E1<E2, the first light emitting element 41 does not emit light, and the second light emitting element 42 emits light. In this situation, the potential E1 of the anode 10, the potential E2 of the common electrode 30, and the potential E3 of the cathode 20 are constantly changed under the control of the AC signal, so that the first light emitting element 41 and the second light emitting element 42 emit light constantly alternately. A frequency at which the first light emitting element 41 and the second light emitting element 42 alternately emit light is controlled by a frequency of the AC signal.

Alternatively, a direct current (DC) signal is input to the first signal terminal E and the second signal terminal F so that the first light emitting element 41 or the second light emitting element 42 emits light under the control of the DC signal.

In this situation, under the control of the DC signal, light emitting principles of the first light emitting element 41 and the second light emitting element 42 are the same as those of the above case when the AC signal is input, with a difference lying in that, under the control of the DC signal, the potential E1 of the anode 10, the potential E2 of the common electrode 30 and the potential E3 of the cathode 20 may maintain a stable pressure difference, so that a forward bias voltage may be formed for the first light emitting element 41 and a reverse bias voltage may be formed for the second light emitting element 42, so that the first light emitting element 41 emits light, and the second light emitting element 42 does not emit light; or, a forward bias voltage may be formed for the second light emitting element 42, and a reverse bias voltage may be formed for the first light emitting element 41, so that the first light emitting element 41 does not emit light, and the second light emitting element 42 emits light.

In this way, by controlling the potentials of the anode 10, the cathode 20 and the common electrode 30, the first light emitting element 41 or the second light emitting element 42 may be controlled to emit light solely, or alternatively, the first light emitting element 41 and the second light emitting element 42 may alternately emit light. Compared with the OLED device of related art having only one organic light emitting layer, a service life of the OLED device is substantially improved when the above method is used to drive any one of the above OLED device, and at the same time, the problem of poor display effect due to the degradation of the material of the organic light emitting layer during the late stage of the use of the OLED device of the related art may be avoided, thereby improving display performance of OLED devices.

Figure 4:
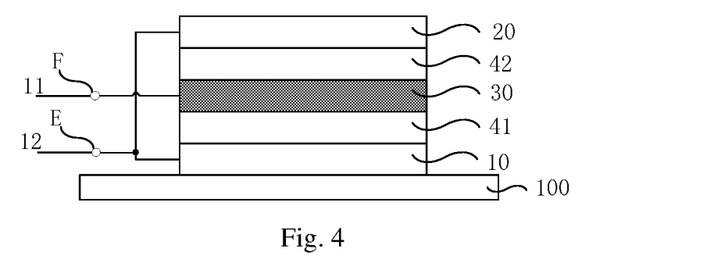
FIG. 4 is a schematic partial structural diagram of an OLED substrate provided by an embodiment of the present disclosure.
Figure 5:
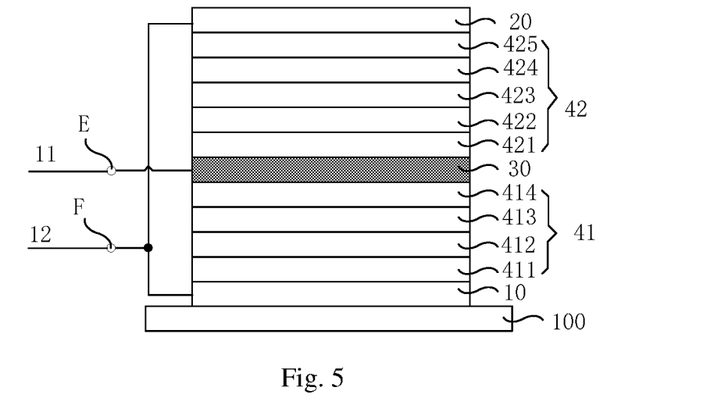
FIG. 5 is a specific schematic structure diagram of a first light emitting layer and a second light emitting layer in the OLED substrate shown in FIG. 4.

An embodiment of the present disclosure provides an OLED substrate. A portion of the OLED substrate, as shown in FIG. 4, includes a power supply line 11, a common signal line 12, and a plurality of any type of the above-mentioned OLED devices arranged in an array on the substrate 100 (FIG. 4 shows an OLED substrate including an OLED device as an example). As shown in FIG. 4, the common signal line 12 may be connected with the first signal terminal E of each of the OLED devices, and the power line 11 may be connected with the second signal terminal F of the OLED device through a transistor; or alternatively, as shown in FIG. 5, the common signal line 12 may be connected to the second signal terminal F of the OLED device, and the power line 11 may be connected to the first signal terminal E of the OLED device through a transistor. For example, a specific structure of the first light emitting element 41 and the second light emitting element 42 in the OLED substrate may be as shown in FIG. 5.

Figure 6A:
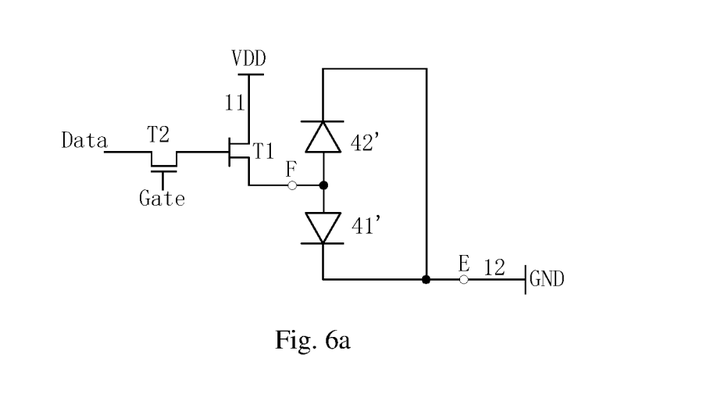
FIG. 6a is an equivalent circuit connection diagram of the OLED substrate shown in FIG. 4.
Figure 6B:
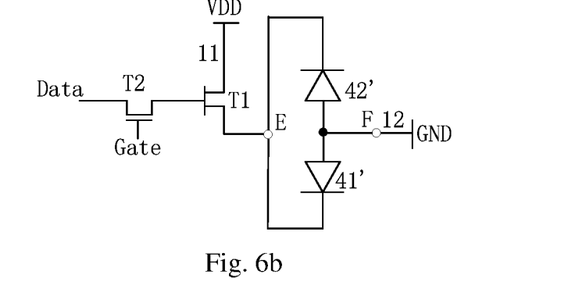
FIG. 6b is an equivalent circuit connection diagram of the OLED substrate shown in FIG. 5.

In order to clearly illustrate the above-described connection relationship of the first signal terminal E, the second signal terminal F, the power line 11, and the common signal line 12, the present disclosure provides FIGS. 6a and 6b. FIG. 6a and FIG. 6b are schematic diagrams of two equivalent circuits of an OLED device provided by embodiments of the present disclosure. Here, the first light emitting element 41 is equivalent to a diode 41', and the second light emitting element 42 is equivalent to a diode 42'. In FIG. 6a, the first signal terminal E is connected to the common signal line 12, and the power line 11 is connected to the second signal terminal F through the transistor T1. In FIG. 6b, the common signal line 12 is connected to the second signal terminal F of the OLED device, and the power line 11 is connected to the first signal terminal E of the OLED device via the transistor T1.

The embodiments of the present disclosure provide an OLED substrate having a plurality of OLED devices as described above. The OLED substrate has a same structure and advantageous effects as those of the OLED device provided by the foregoing embodiments. The specific structures and advantageous effects of the OLED devices have been described in detail in the foregoing embodiments and will not be repeated here.

Figure 7:
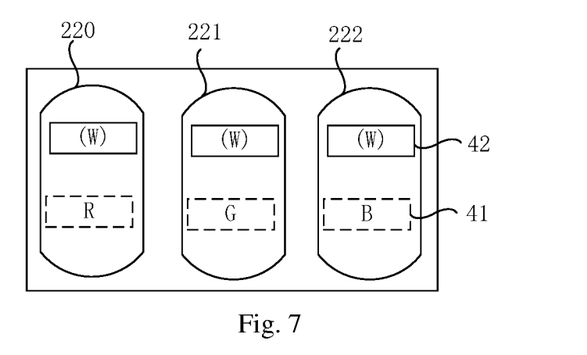
FIG. 7 is a top view of the OLED substrate shown in FIG. 4.
Figure 8:
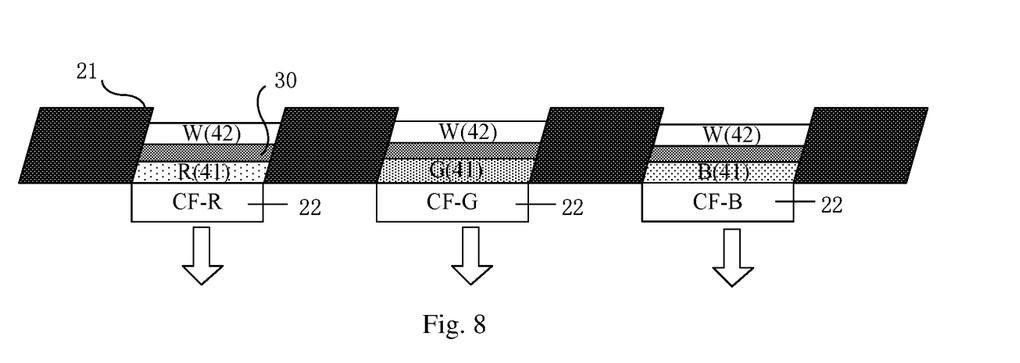
FIG. 8 is another schematic structural diagram of an OLED substrate provided by an embodiment of the present disclosure.

FIG. 7 is a partial top view of an OLED substrate provided by an embodiment of the present disclosure. Parenthesized characters in FIG. 7 indicate a specific color of light emitted by the second light emitting element 42 at the top layer, and un-parenthesized characters indicate a specific color of light emitted by the first light emitting element 41 at the bottom layer. As shown in FIG. 7, the OLED substrate is divided into a red sub-pixel region 220, a green sub-pixel region 221, and a blue sub-pixel region 222. Each of the sub-pixel regions includes a first light emitting element 41 and a second light emitting element 42 that are stacked. The first light emitting element 41 located in the red sub-pixel region 220 includes a red organic light emitting layer R, the first light emitting element 41 located in the green sub-pixel region 221 includes a green organic light emitting layer G, and the first light emitting element located in the blue sub-pixel region 222 includes a blue organic light emitting layer B. The second light emitting element 42 in each of the sub-pixel regions includes a white light emitting layer W. Based on this, as shown in FIG. 8, the OLED substrate further includes a color filter (abbreviated as: CF) 22 located on a light exiting side of the OLED device (see FIG. 8 for the color filter 22). The color of a respective one color filter 22 is the same as the color of the sub-pixel region where it is located. For example, in the red sub-pixel region 220, the color filter 22 is a red filter.

It should be noted that, in other embodiments, positions of the first light emitting element 41 and the second light emitting element 42 may be switched. For example, as shown in FIG. 8, the first light emitting element 41 is located above the second light emitting element 42.

Based on this, when the partial top view of the OLED substrate is as shown in FIG. 7, when the first light emitting element 41 is controlled to emit light, the red organic light emitting layer R emits red light; when the second light emitting element 42 is controlled to emit light, a white light emitted by the white light emitting layer passes through the color filter 22, that is, the red filter, so that the second light emitting element 42 emits red light. The principle of the light emission of the first light emitting element 41 and the second light emitting element 42 in other sub-pixel regions may be the same and will not be repeated here.

In addition, as shown in FIG. 8, the OLED substrate may further include a black matrix 21. The black matrix 21 is typically in a form of a grid mesh, and hollow regions of the black matrix 21 are the sub-pixel regions.

On this basis, when the colors of the light emitting layers in the respective sub-pixel regions are different, it is necessary to shield other sub-pixel regions using a mask for several times to fabricate the light emitting layers in each sub-pixel region, thereby the process to fabricate an OLED device being more complicated.

Based on this, for example, the white light emitting layer includes a red organic light emitting sub-layer, a green organic light emitting sub-layer, and a blue organic light emitting sub-layer that are stacked; in each light emitting element that includes the white light emitting layer, the organic light emitting sub-layers with same color are arranged in a same layer.

In this situation, the lights emitted by the red organic light emitting sub-layer, the green organic light emitting sub-layer, and the blue organic light emitting sub-layer are mixed so that the light emitting element emits white light. At the same time, when the light emitting element having the white light emitting layer is manufactured, since the organic light emitting sub-layers of the same color are provided in the same layer, in the light emitting elements of each sub-pixel region, the organic light emitting sub-layers with same color may be formed in a same evaporation process, and other sub-pixel regions need not be masked with the mask plate, so that times of using the mask plate and times of performing the evaporation process may be reduced, thereby simplifying the manufacturing process of the OLED device.

An embodiment of the present disclosure provides a display device comprising any one of the OLED substrates as described above and a power module. The power module is connected to the power line 11 and the common signal line 12 to input DC signals or AC signals to the power line 11 and the common signal line 12.

It should be noted that the power module may include one or more of a battery, an adapter, and a power interface circuit. For example, DC signals or AC signals may be input to the power line 11 and the common signal line 12 through a power interface circuit.

In summary, when the DC signals are input to the power line 11 and the common signal line 12, the first light emitting element 41 or the second light emitting element 42 may be caused to emit light, or alternatively, when the AC signals are input to the power line 11 and the common signal line 12, the first light emitting element 41 or the second light emitting element 42 may be caused to emit light alternately.

The embodiments of the present disclosure provide a display device as described above, including any of the OLED substrates described above. The display device may be any products or components having a display function such as a mobile phone, a tablet computer, a television, a monitor, a laptop computer, a digital photo frame, a navigator, etc. The display device has the same structure and advantageous effects as the OLED substrate provided in the foregoing embodiments, and the structure and advantageous effects of the OLED substrate have been described in detail in the foregoing embodiments, which are not repeated herein again.

The embodiment of the present disclosure provides a method for manufacturing an OLED substrate, including a step of forming a power line 11 and a common signal line 12 on a substrate 100, and further comprising:

as shown in FIG. 4, forming an anode 10, a first light emitting element 41, a common electrode 30, a second light emitting element 42, and a cathode 20 on the substrate 100 which are stacked. The anode 10 and the cathode 20 are electrically connected. The electrically connected anode 10 and cathode 20 constitute a first signal terminal E, and the common electrode 30 constitutes a second signal terminal F. The common signal line 12 is connected to the first signal terminal E, the power line 11 is connected to the second signal terminal F through a transistor, or alternatively as shown in FIG. 5, the common signal line 12 is connected to the second signal terminal F, and the power line 11 is connected to the first signal terminal E through a transistor.

Based on this, using the OLED substrate formed by the above manufacturing method, DC signals are inputted to the first signal terminal E and the second signal terminal F to control potentials of the anode 10, the cathode 20, and the common electrode 30, respectively, so that the first light emitting element 41 is subject to a forward bias voltage and the second light emitting element 42 is subject to a reverse bias voltage, so as to control the first light emitting element 41 to emit light and to control the second light emitting element 42 not to emit light, or, so that the second light emitting element 42 is subject to a forward bias voltage and the first light emitting element 41 is subject to a reverse bias voltage, so as to control the first light emitting element 41 not to emit light and to control the second light emitting element 42 to emit light. When AC signals are input to the first signal terminal E and the second signal terminal F, the light emitting principles of the first light emitting element 41 and the second light emitting element 42 are the same as those when the DC signals are input; with a difference lying in that under the control of the AC signals, the forward and reverse bias voltages of the first light emitting element 41 and the second light emitting element 42 are alternately changed so that the first light emitting element 41 and the second light emitting element 42 alternately emit light. In this way, compared with the OLED device of related art having only one organic light emitting layer, the service life of the OLED substrate formed by the above manufacturing method is substantially improved, and at the same time, the problem of poor display effect due to the degradation of the material of the organic light emitting layer during a late stage of the use of the OLED device of the related art may be avoided, thereby improving display performance of OLED devices.

On such a basis, the processes of the related art for manufacturing the respective layers of the OLED substrate include an evaporation process and an inkjet printing process (also known as a solution process). Among others, since the evaporation material in the evaporation process may be purified through sublimation, a material having a higher purity may be obtained; since the solution material in the inkjet printing process may not be purified through sublimation, resulting in a relatively poor purity of the material. In addition, during manufacturing respective layers, impurities adversely affect efficiency and service life of the finished device (for example, exciton quenching). Therefore, the service life of film layer(s) formed by the evaporation process is longer than that of film layer(s) formed by the inkjet printing process.

In combination with the above, for example, the step of forming the first light emitting element 41, the common electrode 30, and the second light emitting element 42 includes:

Step S101, forming a first hole injection layer 411, a first hole transport layer 412, and a first light emitting layer 413 sequentially on the anode 10 with an inkjet printing process.

Step S102, forming a first electron transport layer 414, a common electrode 30, a second hole injection layer 421, a second hole transport layer 422, a second light emission layer 423, a second electron transport layer 424 and an electron injection layer 425 on the first light emitting layer 413 with an evaporation process.

As shown in FIG. 5, the first hole injection layer 411, the first hole transport layer 412, the first light emitting layer 413, and the first electron transport layer 414 constitute a first light emitting element 41; the second hole injection layer 421, the second hole transport layer 422, the second light emitting layer 423, the second electron transport layer 424, and the electron injection layer 425 constitute a second light emitting element 42.

In this situation, in the embodiment of the present disclosure, when the OLED substrate is manufactured, both the vapor deposition process and the inkjet printing process are used. Thus, compared with the situation that the first light emitting element 41 and the second light emitting element 42 are manufactured by the evaporation process only, the service life of respective film layer of the finished OLED substrate using above manufacturing method is relative longer, thereby increasing the service life of respective film layer in the OLED substrate.

Figure 9:
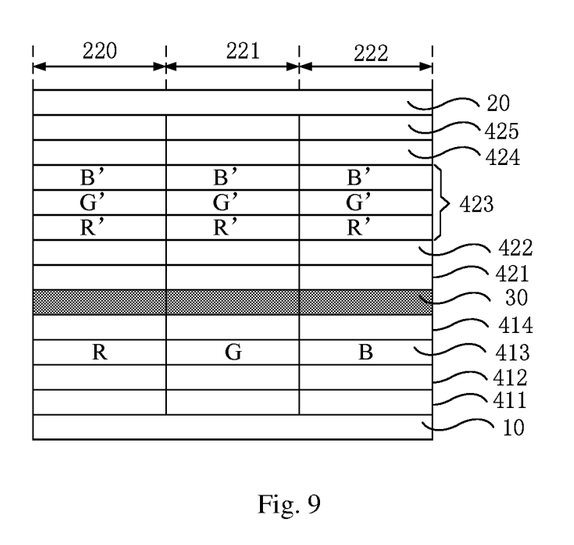
FIG. 9 is a schematic structural diagram of three sub-pixel regions of an OLED substrate according to an embodiment of the present disclosure.

Based on this, considering that when the inkjet printing process is used to manufacture each film layer, it is only needed to control an injection position of the print head, and a mask is not needed. For example, as shown in FIG. 9, the first light emitting layer 413 in one pixel region includes: a red organic light emitting layer R located in a red sub-pixel region 220, a green organic light emitting layer G located in a green sub-pixel region 221, and a blue organic light emitting layer B located in a blue sub-pixel region 222. In this way, by controlling the material of the solution in a respective nozzle corresponding to each sub-pixel region, the organic light emitting layer in each sub-pixel region may be formed by performing the ink jet printing process once, simplifying the manufacturing process of the first light emitting layer 413.

For example, as shown in FIG. 9, the second light emitting layer 423 includes a white light emitting layer. The white light emitting layer includes a red organic light emitting sub-layer R', a green organic light emitting sub-layer G', and a blue organic light emitting sub-layer B' which are stacked. In each of the light emitting elements having a white light emitting layer, the organic light emitting sub-layers with same color are provided in a same layer. In this way, when the second light emitting layer 423 is formed by the evaporation process, the organic light emitting sub-layer in the same layer in each sub-pixel region, for example, the red organic light emitting sub-layer R' may be formed by performing the evaporation process once without shielding other sub-pixel regions by the mask, thereby simplifying the manufacturing process of the second light emitting layer 423.

Based on this, in order to avoid prolonging the manufacturing time of the OLED substrate due to a change of the processing environment, for example, the cathode 20 may also be formed by an evaporation process after the above-mentioned electron injection layer 425 is formed.

In the embodiments of the present disclosure, when the organic light emitting layer is formed by the inkjet printing process, for example, the material of the red organic light emitting layer R (or the red organic light emitting sub-layer R') may include: 4,4'-bis(N-carbazolyl)-1,1'-biphenyl doped 5,6,11,12-tetraphenyltetracene, poly-9,9-dioctyl fluorene polymer doped tris[1-phenylisoquinolinato-C2,N]iridium (III), polyfluorene-alt-carbazole polymer doped tris[1-phenylisoquinolinato-C2,N]iridium(III), poly-9,9-dioctyl fluorene polymer doped 5,6,11,12-tetraphenyltetracene, polyfluorene-alt-carbazole polymer doped 5,6,11,12-tetraphenyltetracene, or polyvinylpyrrolidone doped tris[1-phenylisoquinolinato-C2,N]iridium(III).

For example, the material of the green organic light emitting layer G (or green organic light emitting sub-layer G') may include: 1,3,5-tris(bromomethyl)benzene doped N,N'-dimethylquinacridone, polyfluorene-alt-carbazole polymer doped tris(2-phenylpyridine)iridium, polyfluorene-alt-carbazole polymer doped N,N'-dimethylquinacridone, or polyvinylpyrrolidone doped tris(2-phenylpyridine)iridium.

When the evaporation process is used, the host material of the blue organic light emitting layer B (or blue organic light emitting sub-layer B') includes: 3-tert-butyl-9,10-di(2-naphthyl)anthracene, 9,10-bis(1-naphthyl)anthracene, 4,4'-di(2,2-distyryl)-1,1'-biphenyl, 1,3,6,8-tetraphenylpyrene, 9,9'- spirobifluorene, 4,4'-bis(carbazol-9-yl)biphenyl, or 3,3'-bis(N-carbazolyl)-1,1'-biphenyl. The guest material of the blue organic light emitting layer B (or the blue organic light emitting sub-layer B') includes: 2,5,8,11-tetra-tert-butylperylene, 4,4'-bis(9-ethyl-3-carbazolylvinyl)-1,1'-biphenyl, or 4,4'-[1,4-phenylenebis-(1E)-2,1-ethenediyl]bis[N,N-diphenylaniline].

The foregoing descriptions are merely specific implementation of the present disclosure, but the protection scope of the present disclosure is not limited thereto, and those skilled in the art may easily conceive modification or replacement within the technical scope disclosed by the present disclosure. Therefore, the protection scope of the present disclosure should be based on the protection scope of the claims.

What is claimed is:

1. An OLED device comprising: an anode, a first light emitting element, a common electrode, a second light emitting element, and a cathode, which are arranged in sequence; wherein the second light emitting element comprises a white organic light emitting layer.

2. The OLED device according to claim 1, wherein the anode and the cathode are electrically connected and the electrically connected anode and the cathode constitute a first signal terminal, and the common electrode constitutes a second signal terminal.

3. An OLED substrate comprising a power line and a common signal line, in which the OLED substrate further comprises a plurality of OLED devices according to claim 2 arranged in an array on a substrate;
wherein the common signal line is connected to the first signal terminal of each of the OLED devices, and the power line is connected to the second signal terminal of each of the OLED devices through transistors; or the common signal line is connected to the second signal terminal of each of the OLED devices, and the power line is connected to the first signal terminal of each of the OLED devices through transistors.

4. The OLED substrate according to claim 3, wherein the OLED substrate comprises red sub-pixel regions, green sub-pixel regions, and blue sub-pixel regions;
the first light emitting element of the OLED device in the red sub-pixel region comprises a red organic light emitting layer, the first light emitting element of the OLED device in the green sub-pixel region comprises a green organic light emitting layer, the first light emitting element of the OLED device in the blue sub-pixel region comprises a blue organic light emitting layer;
the second light emitting element in each of the sub-pixel regions comprises a white light emitting layer.

5. The OLED substrate according to claim 4, further comprising a color filter on a light exiting side of the OLED device.

6. The OLED substrate according to claim 5, wherein the white light emitting layer comprises a red organic light emitting sub-layer, a green organic light emitting sub-layer and a blue organic light emitting sub-layer which are stacked; in each of the light emitting elements of the plurality of the OLED devices of the OLED substrate having the white light emitting layer, the organic light emitting sub-layers with same color are in a same layer.

7. The OLED device according to claim 1, wherein a material of the common electrode comprises a metal material; or a material of the common electrode comprises a metal material and a charge transport material; and wherein a content of the metal material of the common electrode is 2%~30%, and wherein the content is a mass content, a molar content, or a volume content.

8. The OLED device according to claim 1, wherein the first light emitting element between the anode and the common electrode comprises a first hole transport layer, a first light emitting layer, and a first electron transport layer which are arranged in sequence in a direction from the anode to the common electrode.

9. The OLED device according to claim 1, wherein the second light emitting element between the common electrode and the cathode comprises a second hole transport layer, a second light emitting layer and a second electron transport layer which are arranged in sequence in a direction from the common electrode to the cathode.

10. The OLED device according to claim 1, wherein the first light emitting element comprises one of a red organic light emitting layer, a green organic light emitting layer, and a blue organic light emitting layer.

11. A method for driving an OLED device according to claim 1, comprising:
inputting an AC signal to the OLED device, so that the first light emitting element and the second light emitting element emit light alternately under the control of the AC signal;
or, inputting a DC signal to the OLED device, so that the first light emitting element or the second light emitting element emits light under the control of the DC signal.

12. An OLED substrate comprising a plurality of OLED devices according to claim 1 arranged in an array on a substrate.

13. A display device comprising a power module and the OLED substrate according to claim 12, wherein the power module inputs one of a DC signal and an AC signal to the OLED substrate.

14. A method for manufacturing an OLED substrate according to claim 12, comprising:
forming the anode, the first light emitting element, the common electrode, the second light emitting element comprising the white organic light emitting layer, and the cathode on the substrate, which are stacked in sequence.

15. A method for manufacturing an OLED substrate, wherein the OLED substrate comprises a power line and a common signal line, the method comprising:
forming a first electrode, a first light emitting element, a common electrode, a second light emitting element, and a second electrode sequentially stacked on the substrate; wherein electrically connecting the first electrode and the second electrode, and forming a first signal terminal with the first electrode and the second electrode which are electrically connected and forming a second signal terminal with the common electrode;
wherein connecting the common signal line to the first signal terminal, connecting the power line to the second signal terminal through a transistor, or connecting the common signal line to the second signal terminal, connecting the power line to the first signal terminal through a transistor; and
wherein the first electrode is an anode and the second electrode is a cathode,
wherein forming an anode, a first light emitting element, a common electrode, a second light emitting element, and a cathode sequentially stacked on the substrate, comprises:

forming a first hole injection layer, a first hole transport layer and a first light emitting layer on the substrate sequentially with an ink let printing process;

forming a first electron transport layer, the common electrode, a second hole injection layer, a second hole transport layer, a second light emitting layer, a second electron transport layer and a second electron injection layer sequentially on the first light emitting layer with an evaporation process;

wherein, the first hole injection layer, the first hole transport layer, the first light emitting layer, and the first electron transport layer constitute the first light emitting element; the second hole injection layer, the second hole transport layer, the second light emitting layer, the second electron transport layer, and the electron injection layer constitute the second light emitting element.

16. The method according to claim 15, wherein forming the first light emitting layer of the first light emitting element in the pixel regions so that a red organic light emitting layer is formed in a red sub-pixel region, a green organic light is formed in a green sub-pixel region, and a blue organic light is formed in a blue sub-pixel region.

17. The method according to claim 16, wherein forming the second light emitting layer of the second light emitting element in the pixel regions so that the second light emitting layer comprises a white light emitting layer, wherein the white light emitting layer comprises the red organic light emitting sub-layer, the green organic light emitting sub-layer, and the blue organic light emitting sub-layer which are stacked in each of the sub-pixel regions; and arranging the organic light emitting sub-layers with same color in the white light emitting layer of each of the second light emitting elements in a same layer.

18. An OLED device comprising: an anode, a first light emitting element, a common electrode, a second light emitting element, and a cathode, which are arranged in sequence; wherein a material of the common electrode comprises a metal material; or a material of the common electrode comprises a metal material and a charge transport material; and wherein a content of the metal material of the common electrode is 2%~30%, and wherein the content is a mass content, a molar content, or a volume content.

* * * * *